United States Patent [19]

Lee et al.

[11] Patent Number: 5,541,443
[45] Date of Patent: Jul. 30, 1996

[54] ACTIVE OPTICAL LOGIC DEVICE INCORPORATING A SURFACE-EMITTING LASER

[75] Inventors: Yong H. Lee, Seo-ku; Jong-In Song, Kwangju, both of Rep. of Korea

[73] Assignees: AT&T Corp., Murray Hill; Bell Communications Research, Inc., Livingston, both of N.J.

[21] Appl. No.: 175,422

[22] PCT Filed: May 5, 1992

[86] PCT No.: PCT/US92/03742

§ 371 Date: Dec. 15, 1994

§ 102(e) Date: Dec. 15, 1994

[87] PCT Pub. No.: WO93/22839

PCT Pub. Date: Nov. 11, 1993

[51] Int. Cl.⁶ .................................................. G02B 27/00
[52] U.S. Cl. .................................... 250/551; 250/214 LS; 372/50; 377/102
[58] Field of Search ............................ 250/214 LS, 551; 365/115, 215, 234; 372/8, 50; 377/102

[56] References Cited

U.S. PATENT DOCUMENTS 5,059,788  10/1991  Tashiro et al. .................... 250/551
5,233,556  8/1993  Matsuda .............................. 365/112
5,404,373  4/1995  Cheng ................................... 372/50

FOREIGN PATENT DOCUMENTS 59-22445  2/1984  Japan .

OTHER PUBLICATIONS

"Cascadable Laser Logic Devices: Discrete Integration of Phototransistors with Surface–Emitting Laser Diodes", Y. W. Lee, et al., Electronic Letters, Jan. 31, 1991, vol. 27, No. 3, pp. 216–217.

"Active Optical NOR Logic Devices Using Surfaces–Emitting Lasers", Y. H. Lee, et al., IEEE Photonics Technology Letters; No. 5, May 4, 1992, pp. 479–482.

Primary Examiner—Stephone B. Allen
Attorney, Agent, or Firm—Martin I. Finston

[57] ABSTRACT

A semiconductor optoelectronic device which can be used to perform the logical INVERTER or NOR operation. The device includes a surface-emitting laser 200 electrically coupled to a heterojunction phototransistor 240. When the total illumination intensity at the phototransistor is below a given threshold, the laser is in a lasing state; when the total illumination exceeds the threshold, the laser is in a nonlasing state. The phototransistor is operated at bias voltages below the threshold for avalanche effects.

7 Claims, 4 Drawing Sheets

ACTIVE OPTICAL LOGIC DEVICE INCORPORATING A SURFACE-EMITTING LASER

FIELD OF THE INVENTION

This invention relates to the field of heterojunction electro-optical devices, and more particularly, to electronic circuits in which a surface-emitting semiconductor diode laser is coupled to a heterojunction phototransistor in order to effect logical operations with optical input and output.

ART BACKGROUND

Recently, much interest has focused on the possibility of parallel optical processing of data by means of large, two-dimensional arrays of active, optical, logic gates. Active, optical devices capable of effecting logical functions such as AND and OR have, in fact been reported. See, for example, W. K. Chart, et at., "Optical AND gates using vertically integrated surface emitting laser-phototransistors," PDP-18, Annual Meeting of the Optical Society of America, 1990, Boston, Mass.; T. Numai, et al., "Surface-emitting laser operation in vertical-to-surface transmission electrophotonic devices with a vertical cavity", *Appl. Phys. Lett.* 58 (1991) 1250–1252; and G. R. Olbright, et al., "Cascadable laser logic devices: discrete integration of phototransistors with surface-emitting laser diodes", *Electron. Lett,* 27 (1991) 216–217. However, in the interest of simplicity and versatility, it is advantageous to provide a single logic function which is capable of generating a complete logic family. The AND and OR functions are not complete in that sense.

The NOR logical function does, however, generate a complete logic family. An optical logic device capable of effecting the NOR function has been reported in D. Jie, et al., "Hybrid Optical Bistability and Optical Logic Gates with Avalanche Heterojunction Phototransistor and Semiconductor Laser Diodes", *IEEE J. Quantum Electron.* QE-23 (1987) 1868–1874. Described in that article is an optical logic gate which relies upon the negative resistance behavior of an avalanche heterojunction phototransistor (AHPT) operated in the avalanche breakdown region. That optical logic gate is an optically bistable device which requires bistable switching. However, bistable modes of operation are: undesirable for at least some applications. Moreover, the AHPT is critically biased because the negative differential resistance region is voltage-sensitive. As a result, such a device is relatively unstable against external power-supply fluctuations. Still further, the phenomenon of "critical slowing down", which has been observed in such hybrid bistable optical devices, is expected to limit the speed of such a device.

SUMMARY OF THE INVENTION

We have discovered a cascadable, active, surface-emitting laser logic device, to be referred to as a SELL device, which can perform the NOR logical operation. The device combines a surface-emitting laser and a heterojunction phototransistor (HPT). The HPT does not need to be operated in the avalanche breakdown region. The laser and HPT are readily integrable in a monolithic device. In contrast to the prior art, the laser and HPT are connected in parallel, and that parallel combination is effectively connected in series with a load resistance. As a result, the voltage drop across the load resistance increases when an input beam of at least a threshold intensity (within the range of wavelengths to which the HPT is responsive) illuminates the HPT. Such voltage drop reduces the current through the laser. If the laser current drops below a threshold level, the laser (which is ON so long as the HPT is not illuminated) is turned OFF. Thus, the SELL device is readily employed as a logical inverter. Moreover, two or more optical input beams may be incident on the HPT. In such a case, the SELL device is readily employed as a NOR gate.

DETAILED DESCRIPTION

Figure 1:
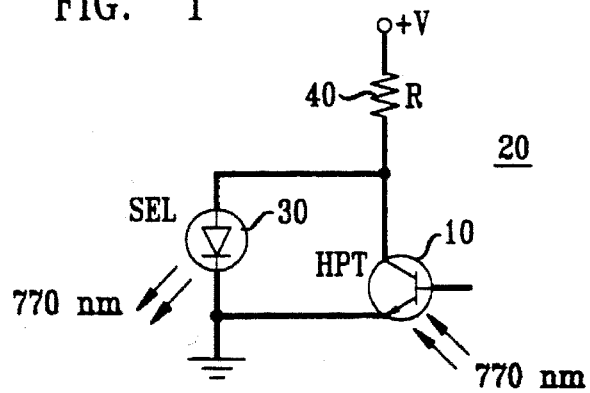
FIG. 1 is a schematic circuit diagram of a SELL device according to the invention.

The combination of a surface-emitting laser with an HPT offers several important advantages. For example, the resulting SELL device combines the functions of a laser source, a broad-spectral-range detector, and a current amplifier. When, for example, the detector material is bulk (i.e., low bandgap) GaAs and the active laser material is a GaAs quantum well structure or AlGaAs, the device is responsive to input optical beams over a relatively broad range of wavelengths shorter than the bandgap wavelength of the detector material. As a consequence, manufacturing non-uniformities both over a single wafer and between wafers (even between wafers provided by different crystal growers) may be tolerable in a system environment. Similarly, the SELL device can be robust against environmental and operational temperature variations, which tend to change lasing wavelengths.

The operation of the SELL device to provide the logical NOR and INVERTER functions is now described with reference to the electrical schematic diagram of FIG. 1. When no light is incident on HPT 10, SELL device 20 is normally ON. In that condition, most of the current flows through surface-emitting laser 30, rather than the HPT. When an input optical beam of at least a certain threshold intensity is impinged on the HPT, the SELL device is turned OFF. In that condition, the photocurrent generated in the HPT is amplified (typically by a factor of 100, or even more) and most of the current flows through the HPT, thereby limiting the current through the surface-emitting laser. The precise amount of current which the HPT must draw in order to turn the device OFF depends on the operating point of the surface-emitting laser diode. However, it is sufficient to reduce the laser current to just below the laser threshold value. We have found that it is not necessary to turn off the laser completely. That is, when the SELL is in the ON state, it is in a lasing mode, generating a relatively large optical output power level. When it is in the OFF state, it is in a light emitting diode mode, generating, at most, a relatively small optical output power level. Thus, in general, current will flow continuously through the SELL device regardless of its logic state. The output intensity ratio between lasing and non-lasing modes insures enough contrast ratio between ON and OFF states for most system applications.

It is clear from the above discussion that the logical inverter function is readily effected using the SELL device. Moreover, by combining two or more optical beams from, e.g., the output portions of two or more previous SELL devices in the HPT input window of a third SELL device, the third SELL device is readily used as an optical NOR logic gate. A single HPT window is generally sufficient for this operation. However, either a single large window or multiple small windows of the same total area are readily provided during mask design processes. Accordingly, multiple, spatially separated windows on a single HPT are readily provided as an alternative to a single window.

According to a currently preferred embodiment, the SELL device consists of an AlGaAs superlattice surface-emitting laser connected to a GaAs/AlGaAs heterojunction phototransistor (HPT) in parallel as shown in FIG. 1. The parallel combination is, in turn, effectively connected in series to load resistance 40. The load resistance may be either external (as shown in the figure), or internal. An exemplary internal load resistor appears as portion 205 of the monolithic SELL device of FIG. 2.

The laser is, e.g., an MBE-grown laser operating at a wavelength of 770 nm. An exemplary structure for such a laser is described in Y. H. Lee, et al., "Deep-Red Continuous Wave Top-Surface-Emitting Vertical Cavity AlGaAs Superlattice Lasers", *IEEE Photon. Tech. Lett.* 3 (1991) 108–109. Briefly, with further reference to FIG. 2, the exemplary structure is a vertical-cavity laser structure including a p-i-n junction with MBE-grown bottom and top mirrors. The SI-doped bottom mirror 210 has 28.5 pairs of an AlAs-$Al_{0.65}Ga_{0.35}As$-$Al_{0.3}Ga_{0.7}As$-$Al_{0.65}Ga_{0.35}As$ quarter-wave stack designed at 780 nm. Superlattice region 220 includes, formed on the bottom mirror, an undoped spacer region consisting of an $Al_{0.14}Ga_{0.86}As$ superlattice active region sandwiched between two graded AlGaAs (x=0.3–0.65) layers such that the combined optical thickness is a full wave. The superlattice region further includes, formed on the spacer region, an $Al_{0.14}Ga_{0.86}As$ superlattice active region which consists of 14 pairs of alternating 33.9Å thick GaAs and 5.7Å thick AlAs layers, grown at 595° C. The Be-doped top mirror 230 consists of 22 periods of AlAs-$Al_{0.65}Ga_{0.35}As$-$Al_{0.3}Ga_{0.7}As$-$Al_{0.65}Ga_{0.35}As$. The two intermediate $Al_{0.65}Ga_{0.35}As$ layers are introduced to reduce p- and n-mirror resistivities.

The laser exemplarily 15µ in diameter. The maximum cw output is typically about 1 mW at room temperature. The threshold current is typically about 11 mA, and the threshold voltage is typically about 3.8V. It should be noted in this regard that in the resulting SELL device, the avalanche breakdown voltage of the HPT must be larger than the threshold voltage of the laser. That is, if the bias voltage exceeds the avalanche breakdown voltage, the SELL device will go into an avalanche mode of operation. In such a mode, a relatively large current will be drawn by the HPT, and the SELL device will remain OFF.

An exemplary discrete HPT is an n-p-n GaAs/AlGaAs HPT grown by, e.g., well-known MOCVD methods. The HPT includes, from the top, a GaAs ohmic contact layer (500Å, Te=$5\times10^{18}cm^{-3}$), an $Al_{0.18}Ga_{0.82}As$ step layer (500Å, Te=$3\times10^{18}cm^{-3}$), a wide bandgap $Al_{0.35}GaO_{0.65}As$ emitter (3000Å, Te=$1\times10^{17}cm^{-5}$), 100Å undoped GaAs, a narrow bandgap GaAs base (1500Å, Zn=$1\times10^{16}$cm-3), a GaAs collector (5000Å, $1\times10^{16}cm^{-3}$), and a GaAs subcollector (2000Å, Te=$1\times10^{18}cm^{-3}$), all grown on an $n^+$ GaAs substrate. Each resulting HPT is exemplarily 50 µm×50 µm in size.

Figure 2:
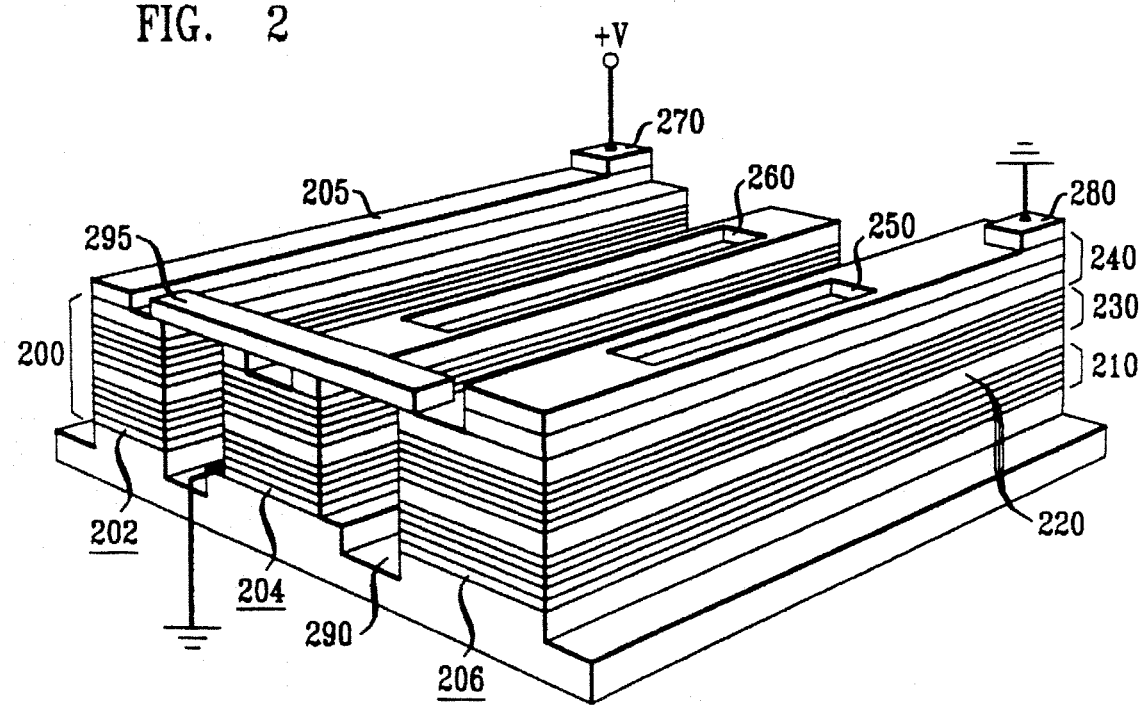
FIG. 2 represents a monolithic embodiment of the SELL device.

With further reference to FIG. 2, in a currently preferred embodiment, HPT 240 is grown directly on the topmost layer of laser structure 200, e.g., on the topmost $Al_{0.3}Ga_{0.7}As$ layer of Be-doped top mirror 230 of the exemplary laser structure described above. The restfit of growing the HPT directly on the laser structure is a monolithically integrated device. The integrated HPT is similar to the exemplary discrete HPT described above. Accordingly, the first-grown layer of the integrated HPT is the subcollector, followed, in sequence, by the collector, the base, the 100Å undoped GaAs layer, and the emitter.

As shown in FIG. 2, the laser structure is separated into portions 202, 204, and 206 by trenches 290. The trenches serve to electrically isolate the respective portions. Portion 204 is the light-emitting portion of the SEL structure. Portion 206 serves as a platform for HPT 240. Portion 202 serves as a platform for portions of the base and emitter layers of the HPT structure. Strip-like portion 205 of the base layer serves as the load resistor, as noted above. The top, i.e., subcollector, layer of HPT 240 is overcoated with a gold electrode, except for the region of window 250. Light which enters window 250 is incident through the collector, and is absorbed by the base and collector of the HPT. Strip-like portion 295 is a gold conductor strip, which is readily formed by, e.g., evaporative deposition after trenches 290 are filled with a suitable insulating material such as polyimide.

Figure 3:
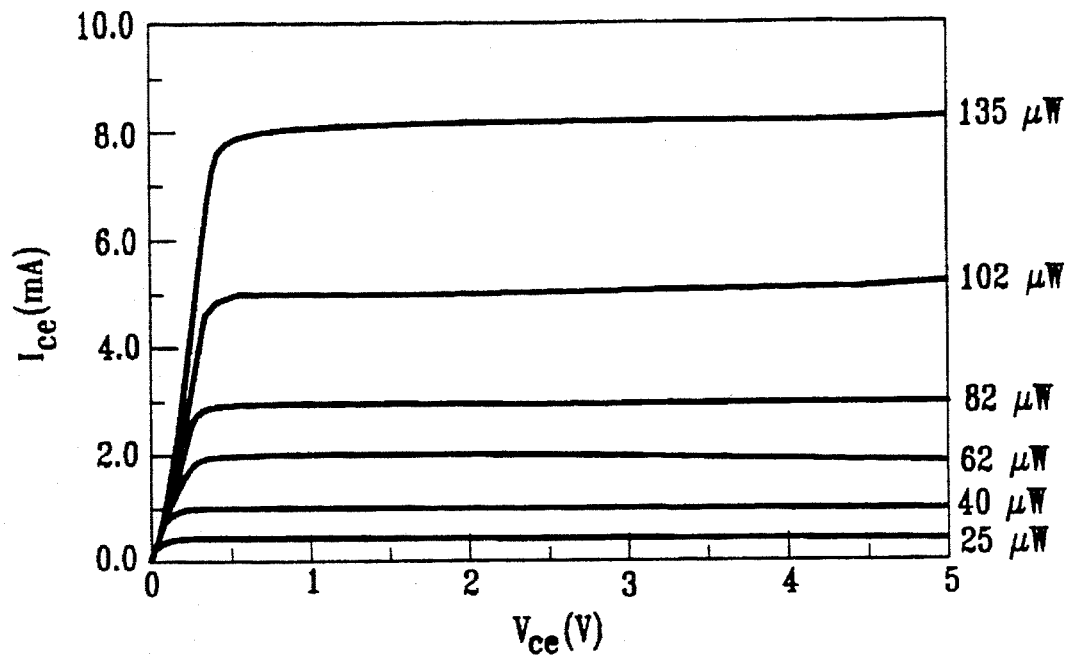
FIG. 3 is a set of I–V curves of an exemplary heterojunction phototransistor (HPT) at various incident optical power levels. The absorbed optical power is estimated to be 44% of the incident optical power.

A typical I–V characteristic of the exemplary HPT is plotted in FIG. 3 for each of various incident light levels. Photocurrent gain greater than 100 is observed with incident optical power greater than 80 µW. Avalanche effects are observed when the bias applied between the emitter and the collector of the HPT exceeds 6.4V. We have estimated that about 44% of the incident laser power is absorbed by the undoped GaAs, the base, collector and subcollector of the HPT.

As discussed below, in a laboratory experiment we have demonstrated a system gain of the SELL (including optical system losses from lenses and beam splitters) of about 3. We believe that this value can be doubled by including an anti-reflection coating on the upper surface of the HPT and, in the monolithically integrated structure of, e.g., FIG. 6, by using that portion of the highly reflective laser mirror structure that underlies the HPT. The gain can be increased still more by increasing the value of the load resistance, at the cost of incurring a greater thermal budget.

As noted, a monolithic embodiment of the SELL device is depicted in FIG. 2. Such an embodiment is readily fabricated using standard integrated circuit fabrication techniques, combined with deep etching techniques for forming, e.g., isolation trenches 290. An exemplary method for forming such trenches is chemically assisted ion beam etching, described, e.g., in A. Scherer, et at., "Fabrication of microlasers and microresonator optical switches", *Appl. Phys. Lett.* 55, (1989) 2724–2726. In the exemplary, monolithic embodiment, optical input is via window 250 in the HPT, and optical output is via window 260 in the surface-emitting laser. Power input is provided by way, e.g., of terminals 270 and 280.

The operation of a two-dimensional array of such monolithic SELL devices requires only two electrical wires to apply one common electrical bias. The input data are readily provided as an array of laser beams from, e.g., a previous array of SELL devices. The size and spacing of such a SELL, device array will be limited by the thermal budget of the surface-emitting lasers. Consequently, it is desirable, at least in the design of large arrays, to minimize the threshold current and voltage of the lasers.

Figure 7:
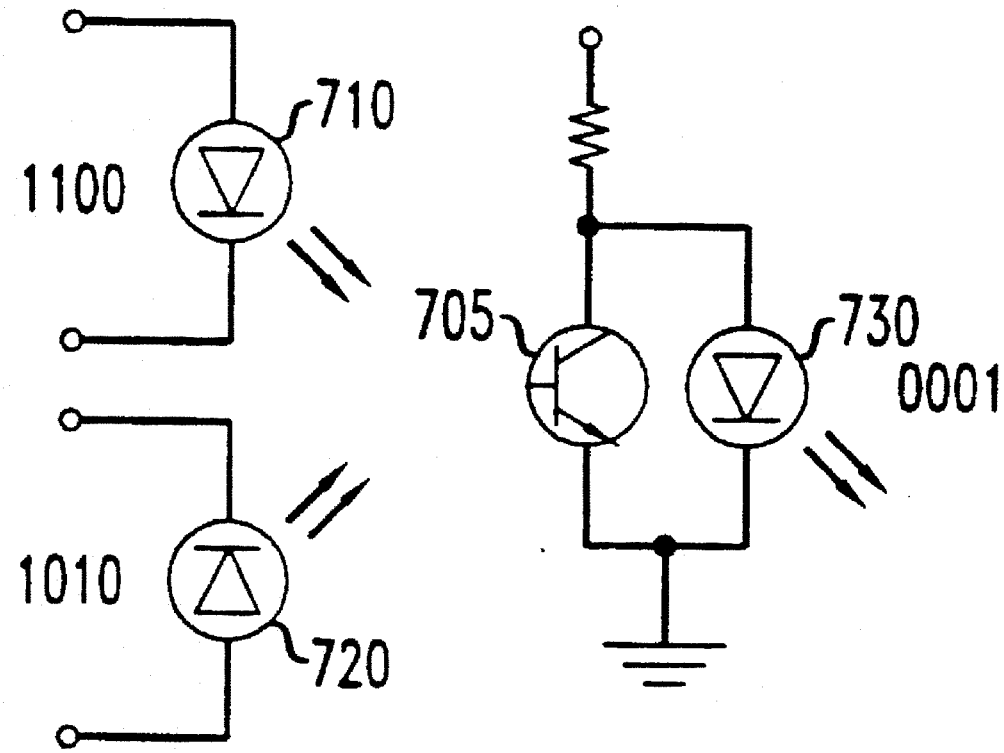
FIG. 7 is a schematic representation of a SELL device coupled to two surface-emitting laser diodes as optical input sources. In such an arrangement, the SELL device is readily used to perform the logical NOR function.

Schematically illustrated in FIG. 7 is a SELL device 700, in which HPT 705 is arranged to receive optical input from two surface-emitting laser diodes 710, 720. In such an arrangement, the SELL device is readily used to perform the logical NOR function. Such an arrangement is readily generalized to n inputs, n an integer at least 2. The optical input intensity from each of the n input light sources, when in the ON state, should equal at least the threshold for mining off SELL laser 730. The sum of all such intensities when all of the input sources are in the OFF state should be small enough to avoid turning off laser 730. Accordingly, the input intensity from each of the n input sources, when in the OFF state, is desirably less than 1/n times the threshold intensity needed to mm off laser 730.

EXAMPLE

Figure 4:
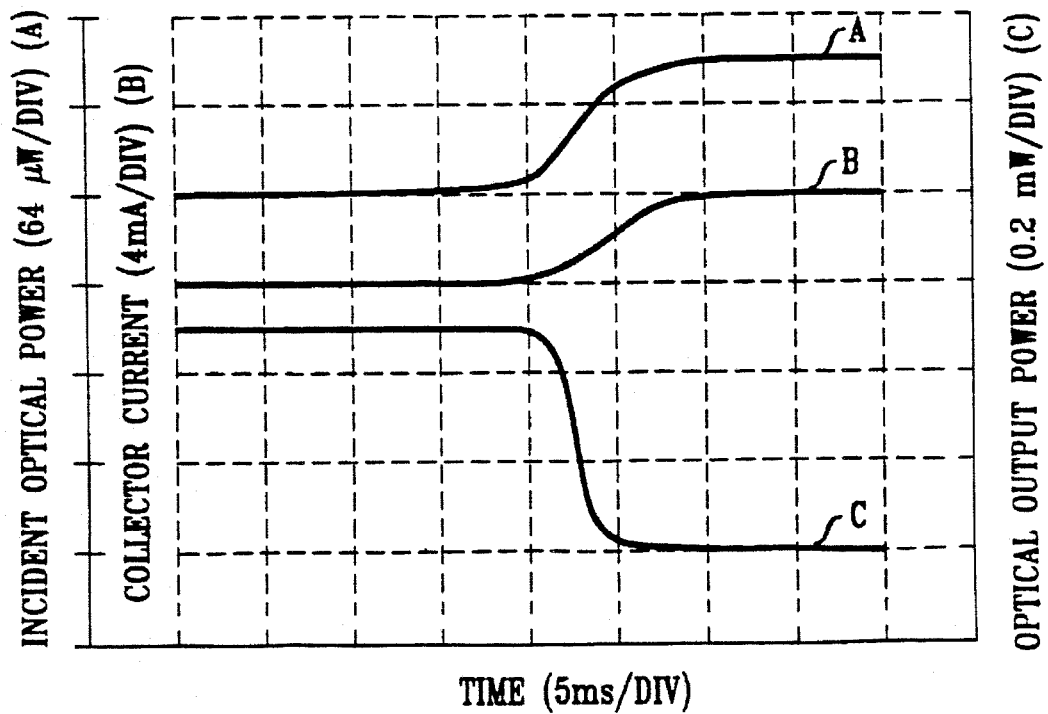
FIG. 4 shows certain characteristics of an exemplary SELL device as functions of time. The characteristics are: the incident optical power, the HPT collector current, and the optical output power.

For evaluative purposes, we built and tested a discretely wire-connected version of the SELL device. To demonstrate cascadability, we used two 15-μm-diameter circular AlGaAs surface-emitting lasers, substantially as described above and taken from the same wafer. One laser was used as a part of a SELL device. The output of the other laser was used as an input to the HPT part of the SELL device. The load resistance was 100Ω. Shown in FIG. 4 are certain measured characteristics of the SELL device, namely, the incident optical power (curve A), HPT collector current (curve B), and optical output power (curve C). As shown in the figure, the incident optical power level was slowly scanned up to 100 μW. With no input, the SELL output power was 0.5 mW. Clear turn-off is demonstrated in curve C of FIG. 4.

The SELL output power of 0.5 mW was controlled. OFF with 100 μW of light incident (44 μW absorbed) on the HPT, demonstrating the inverter or NOR function with a negative optical gain of 5. Taking into account all of the optical system losses from lenses and beam splitters, we evaluated the system gain of the SELL device at about 3.

Figure 5:
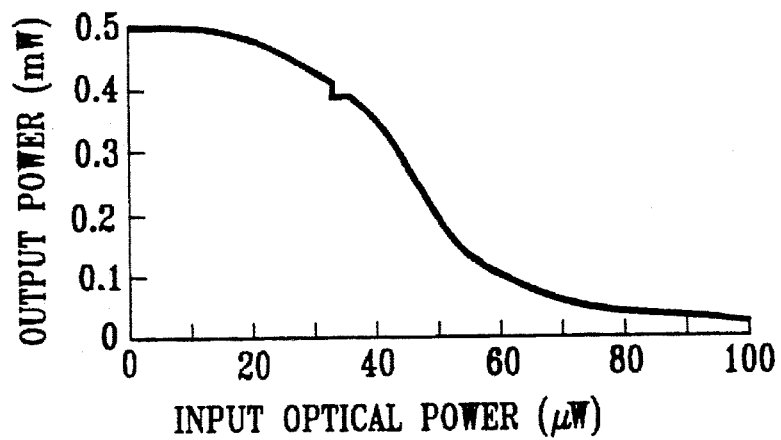
FIG. 5 is a typical plot of optical output power versus optical input power of an exemplary SELL device.

A typical input venus output characteristic of the SELL device is shown in FIG. 5. The slope of the curve is proportional to the negative optical gain of the SELL device. The kink in this curve is from the effects of the onset of a higher order transverse mode of the surface-emitting laser that was used.

Controlling higher output power requires correspondingly higher input beam power to drain more current through the HPT. It is desirable to design the SELL device to be insensitive to the operating condition of the surface-emitting laser diode. This may be achieved by, e.g., minimizing the electrical resistance through the HPT, relative to that of the surface-emitting laser.

Figure 6:
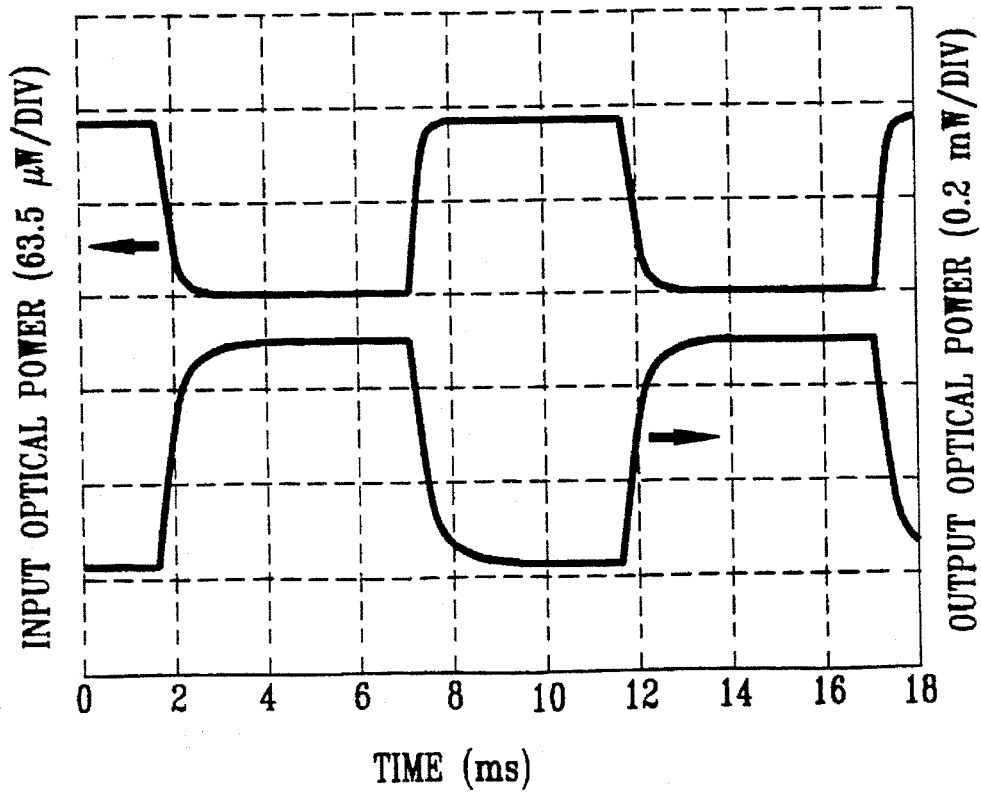
FIG. 6 depicts a pair of oscillographic traces illustrating logical inverter operation of an exemplary SELL device. The upper trace represents the incident laser power (63.5 µW/division), and the lower trace represents the SELL device output power (0.2 µW/division).

The inverter operation of the SELL device is shown in FIG. 6. The speed of the curve in FIG. 6 (which shows turn-on and turn-off times of about 0.5 ms) was limited by the response time of the power meter used for the measurements, and therefore does not reflect the actual capabilities of the device that was tested. In a monolithically integrated SELL device, we believe that the turn-on speed will be determined by the switch-on time of the surface-emitting laser, which is expected to be 1 ns or less, permitting direct modulation at frequencies greater than 1 GHz. In such a device, we expect that the turn-off speed will be determined by the turn-on speed of the HPT. The speed of the HPT will depend on the incident optical power level. Thus, for example, at an optical power level of 50–100 μW, we expect that modulation at frequencies greater than 1 GHz will be possible. High speed current gains of about 100 or even more are expected.

We claim:

1. A semiconductor optoelectronic device which comprises: a surface-emitting laser, to be referred to as an "SEL", having a light-emitting portion; a heterojunction phototransistor, to be referred to as an "HPT", electrically coupled to the SEL and including a base layer and input means for admitting input light, in at least a given range of wavelengths, to the base layer from one or more light sources, the input light from all of said sources having a total input light intensity; and contact means for applying a laser current to the SEL, a transistor current to the HPT, and a bias voltage to the HPT; wherein associated with the SEL is a laser threshold current such that the SEL will lase only if the laser current equals or exceeds the laser threshold current, and associated with the HPT is a normal voltage range such that if the bias voltage lies within such range, the HPT will operate substantially without avalanche breakdown effects, characterized in that:

a) the HPT and at least the light-emitting portion of the SEL are electrically connected in parallel, and are coupled to the contact means through a load resistance; and b) the laser threshold, current and the load resistance are selected such that for at least some bias voltage within the normal operating range of the HPT, there exists an input optical threshold such that the SEL will lase if and only if the total input light intensity in the given wavelength range, to the base of the HFF, is less than the input optical threshold.

2. The device of claim 1, wherein the SEL comprises a plurality of semiconductor layers grown sequentially on a semiconductor substrate, and the HPT is formed in direct contact with the last-grown of said layers.

3. The device of claim 1, wherein the input means are adapted to admit input light from at least two light sources.

4. The device of claim 1, wherein associated with the SEL is a logical ON state when it is lasing and a logical OFF state when it is not lasing, and the device further comprises a light source optically coupled to the input means, a logical ON state being associated with the light source when the input light from the light source has an intensity which equals or exceeds the input optical threshold, and a logical OFF state being associated with the light source when the input light from the light source has an intensity which is less than a given fraction of the optical threshold, such that the state of the SEL is related to the state of the light source by the logical inversion function.

5. The device of claim 1, wherein associated with the SEL is a logical ON state when it is lasing and a logical OFF state when it is not lasing, and the device further comprises n light sources optically coupled to the input means, n an integer at least 2, a logical ON state being associated with each light source when the input light from that light source has an intensity which equals or exceeds the input optical threshold, and a logical OFF state being associated with each light source when the input light from that light source has an intensity which is less than a given fraction of the optical threshold, said fraction being less than $1/n$, such that the state of the SEL is related to the states of the n light sources by the logical n-input NOR function.

6. The device of claim 4, wherein the light source is an SEL.

7. The device of claim 5, wherein each of the light sources is an SEL.

* * * * *